United States Patent [19]
Gilbert

[11] Patent Number: 6,144,244
[45] Date of Patent: Nov. 7, 2000

[54] LOGARITHMIC AMPLIFIER WITH SELF-COMPENSATING GAIN FOR FREQUENCY RANGE EXTENSION

[75] Inventor: Barrie Gilbert, Portland, Oreg.

[73] Assignee: Analog Devices, Inc., Norwood, Mass.

[21] Appl. No.: 09/241,359

[22] Filed: Jan. 29, 1999

[51] Int. Cl.[7] .................................................. H03G 11/08
[52] U.S. Cl. ............................................ 327/350; 327/67
[58] Field of Search .................................... 327/350, 351, 327/352, 65, 66, 67, 362; 330/252, 254

[56] References Cited

U.S. PATENT DOCUMENTS

| | | | |
|---|---|---|---|
| 5,063,311 | 11/1991 | Swapp ......................................... | 327/65 |
| 5,329,173 | 7/1994 | Murakami et al. ......................... | 327/65 |
| 5,489,868 | 2/1996 | Gilbert ...................................... | 327/351 |
| 5,818,279 | 10/1998 | Dick ......................................... | 327/350 |

OTHER PUBLICATIONS

Analog Devices Product Guide; Low Cost DC–500 MHz, 92 dB Logarithmic Amplifier "AD8307", Rev. 0; Norwood, MA; 1997 (pp. 1–20).

*Primary Examiner*—Toan Tran
*Attorney, Agent, or Firm*—Marger Johnson & McCollom, P.C.

[57] ABSTRACT

A progressive-compression logarithmic amplifier, amplifier stage, and method for increasing the bandwidth of a differential-input progressive-compression logarithmic amplifier are disclosed. The amplifier stage provides positive gain increases for decreases in the impedance of the load driven by the stage. When multiple amplifier stages of this type are cascaded, the gain increase in each stage compensates for high-frequency roll-off due to the input capacitance of the following stage. The compensating is activated by the roll-off effect itself, making the device self-compensating. This is preferably accomplished by providing a drive current sensing path that makes each node of the stage's differential output respond in opposition to the drive current drawn at the stage's other differential output—that is, an increase in drive current at one output node drops the voltage at the other output node.

21 Claims, 4 Drawing Sheets

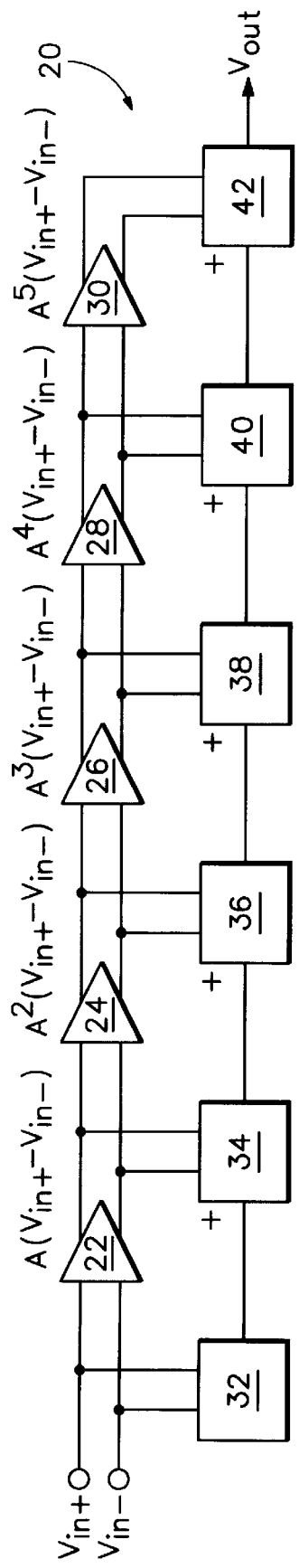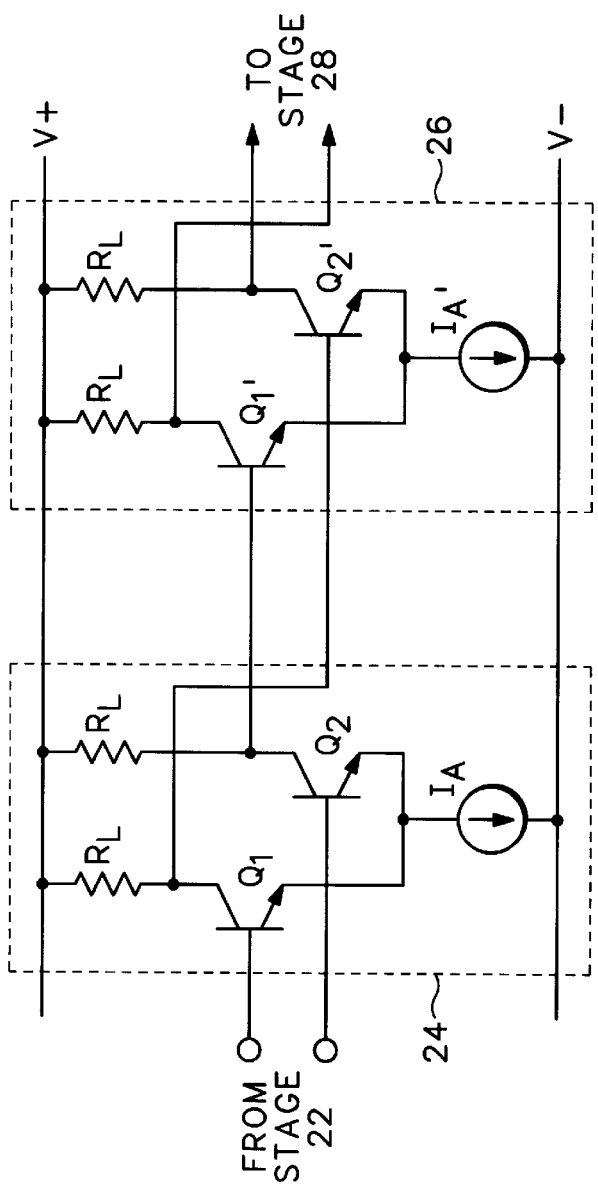

LOGARITHMIC AMPLIFIER WITH SELF-COMPENSATING GAIN FOR FREQUENCY RANGE EXTENSION

BACKGROUND OF THE INVENTION

1. Field of the Invention

This invention pertains generally to logarithmic amplifiers, and more particularly to progressive-compression logarithmic amplifiers.

2. Background of the Invention

A logarithmic amplifier has a transfer function that relates its output signal to the decibel (dB) magnitude of its input signal. A typical logarithmic amplifier can respond accurately to an input having a dynamic range of 70 dB or more, with some devices capable of responding to an input having a dynamic range of over 100 dB.

Progressive-compression logarithmic amplifiers approximate a logarithmic transfer function by cascading several amplifier stages, with each stage having a non-logarithmic transfer function. For instance, each stage may be implemented as an "A/0" stage. An A/0 stage has a transfer function resembling the mathematical tanh function—such stages have a linear gain A for small inputs. The gain for further increases in input rolls off to 0 as the amplifier reaches saturation. The A/0 tanh stage has several advantages that make it ideal for a logarithmic amplifier: it is simple to build, when cascaded and augmented with the means to sum the outputs of these individual cells, it can provide a low-ripple logarithmic approximation, its scaling parameters (slope and intercept) can be made relatively insensitive to temperature changes, and these parameters can be rendered insensitive to supply voltage variations.

FIG. 1 shows a five-stage demodulating progressive-compression logarithmic amplifier 20. The amplifier uses five cascaded A/0 stages 22, 24, 26, 28, and 30. Each stage has a differential input, and can accept an input voltage ($V_{in+}-V_{in-}$) that is either positive or negative. The differential outputs of the five cascaded stages are combined by summing the outputs of fullwave detectors 32, 34, 36, 38, 40, and 42, such that for a small differential input voltage, $$V_{out} (1+A+A^2+A^3+A^4+A^5)|V_{in+}-V_{in-}|$$

As the differential input voltage increases, stage 30 will eventually reach its stage output limit L and its incremental gain will go to zero. For further increases in differential input voltage, $$V_{out} (1+A+A^2+A^3+A^4)|V_{in+}-V_{in-}|+L.$$

It can be appreciated that as the differential input voltage continues to rise, stages 28, 26, 24, and 22 will reach their output limits in turn. $V_{out}$ thus approximates a logarithmic response because the amplifier "shuts down" amplifier stages at exponentially-spaced intervals as the differential voltage increases.

FIG. 2 shows two connected A/0 amplifier stages 24 and 26. Stage 24 uses matched transistors $Q_1$ and $Q_2$ and their loads $R_L$ in a well-known differential pair configuration. With a zero differential voltage input, the current provided by constant current source $I_A$ splits equally between transistors $Q_1$ and $Q_2$, and the differential output taken at loads $R_L$ is also zero. For small differential input voltages, the current split between transistors $Q_1$ and $Q_2$ becomes proportionally unbalanced, such that the differential output taken at loads $R_L$ represents an amplified version of the differential input. As the differential input increases, eventually all of the available bias current will be shunted through either $Q_1$ or $Q_2$, and the incremental gain for further increases will go asymptotically to zero. Logarithmic amplifier 20 of FIG. 1 can be implemented by connecting each of the stages of FIG. 1 as shown for stages 24 and 26 of FIG. 2.

In many applications, a logarithmic amplifier having a wide input frequency response of over 1 GHz is desirable. For a progressive-compression log amplifier, each stage capacitively loads its preceding stage (e.g., in FIG. 2, stage 26 loads stage 24), causing the amplifier gain to progressively roll-off at frequencies above some corner frequency. The corner frequency can be related to the time constant of the RC low-pass network formed by one stage's load resistances and the following stage's effective input capacitance. In practice, such loading effects can severely limit the frequency response of the amplifier, so that accurate operation at very high frequencies is precluded.

The corner frequency of a cascaded amplifier can be greatly extended by substituting the stage configuration of FIG. 3 for that of FIG. 2. The differential pair $Q_1$, $Q_2$ of FIG. 3 has outputs that are buffered by emitter followers $Q_3$ and $Q_4$. The emitter follower configuration reduces the effective output resistance driving the next stage's input capacitance, typically by an order of magnitude or more as compared to $R_L$. This decrease can produce a substantial improvement in the corner frequency of a progressive-compression logarithmic amplifier.

SUMMARY OF THE INVENTION

Despite the high-frequency bandwidth extension gained by using the configuration of FIG. 3, the loading of each stage by its following stage remains the dominant bandwidth-limiting factor. The present invention provides compensation for stage loading that further extends the bandwidth of a multi-stage amplifier.

In addition to providing a substantial bandwidth extension, the present invention has several other attributes. Because the stage loading compensation responds to the actual stage loading, the circuit is self-compensating. This also allows for a device with stage loading compensation that is tailored to the specific loading in that particular device. Circuit values can also be tailored to provide different levels of compensation, while retaining the property of automatically compensating as device parameters vary. It can be implemented without significant circuit complication, and without increasing the power consumption of the overall amplifier.

In one aspect of the present invention, an amplifier gain cell is provided. The amplifier gain cell is of the type having a differential input gain section with two differentially-connected current paths, each path having an identical amplifier load and an output node. The gain cell also has two output buffers, one connected to the output node of each current path. The output buffer configuration automatically adjusts the stage gain to compensate for changes in the output load impedance presented to the stage. For instance, the output buffers can be cross-connected such that each draws at least a portion of its respective output drive current through at least a portion of the amplifier load of the current path connected to the other output buffer.

In a second aspect of the present invention, a progressive-compression logarithmic amplifier is provided. The amplifier comprises multiple amplifier stages connected in series. At least one of the amplifier stages that is followed by another amplifier stage comprises a differential input gain section, an output buffer section, and a stage loading positive feedback path that automatically adjusts the gain of the stage in response to input impedance changes in the following stage. Preferably, each amplifier stage that is followed by another amplifier stage has this configuration.

In a further aspect of the present invention, a differential input gain section is disclosed that compensates for changes in its own impedance. This gain section comprises two differentially-connected current paths, each comprising first and second serially-connected loads, an input transistor, and a compensating transistor. The emitter of the compensating transistor supplies collector current to the input transistor in its path. The collector of the compensating transistor draws current from the second load in its path. And the base of the compensating transistor in each path is cross-connected to the first load in the other path.

In still another aspect of the invention, a method for increasing the bandwidth of a progressive-compression logarithmic amplifier is provided. In this method, a differential voltage input at a first stage of the amplifier is amplified through a differential-pair amplifier having two load paths. The differential-pair amplifier produces an amplified differential voltage output at a pair of output nodes, one in each load path. The amplified differential voltage output is buffered using an output buffer inserted between each differential-pair output node and a stage differential voltage output. The output buffers supply drive current to the differential voltage inputs of a second stage of the amplifier. The drive current required at each differential voltage input of the second stage is sensed, and the first stage responds to an increase in drive current required at one differential voltage input of the second stage by changing (e.g., dropping) the voltage at the other differential voltage input. Preferably, the sensing and responding steps are implemented by drawing the drive current supplied by each output buffer, or at least a portion of it, through at least a portion of the load path of the differential pair that the other of the output buffers is connected to. This sensing can be used to compensate for amplifier roll-off at high frequency by increasing the stage gain in a frequency-dependent manner.

BRIEF DESCRIPTION OF THE DRAWINGS

The invention may be best understood by reading the disclosure with reference to the drawings, wherein:

FIG. 1 shows a prior art progressive-compression logarithmic amplifier;

FIGS. 2 and 3 show prior art logarithmic amplifier stage configurations;

DETAILED DESCRIPTION OF THE PREFERRED EMBODIMENTS

The preferred embodiments are disclosed below as applied to an amplifier stage implemented as an integrated circuit using npn bipolar junction transistors. Those skilled in the art will recognize that the principles taught in the embodiments can also be used in building integrated circuit embodiments using pnp transistors, field-effect transistors, or a mixture of different bipolar and/or field-effect technologies.

Several terms used in this disclosure have defined meanings. For instance, a differential input gain section amplifies a differential signal, i.e., the voltage or current difference between a pair of inputs. A differential input gain section may have a differential or a single-ended output, and it may also convert the format of the differential signal (e.g., from a voltage to a current, or vice-versa). An output buffer replicates an internal signal of a circuit to an external load, and provides the bulk of the drive current demanded by the load. The buffer may level shift the signal, but generally provides close to unity gain. Differentially-connected current paths share a common current source—thus any increase in the current drawn through one of the paths is offset by a similar decrease in current drawn through the other path or paths.

Figure 4:
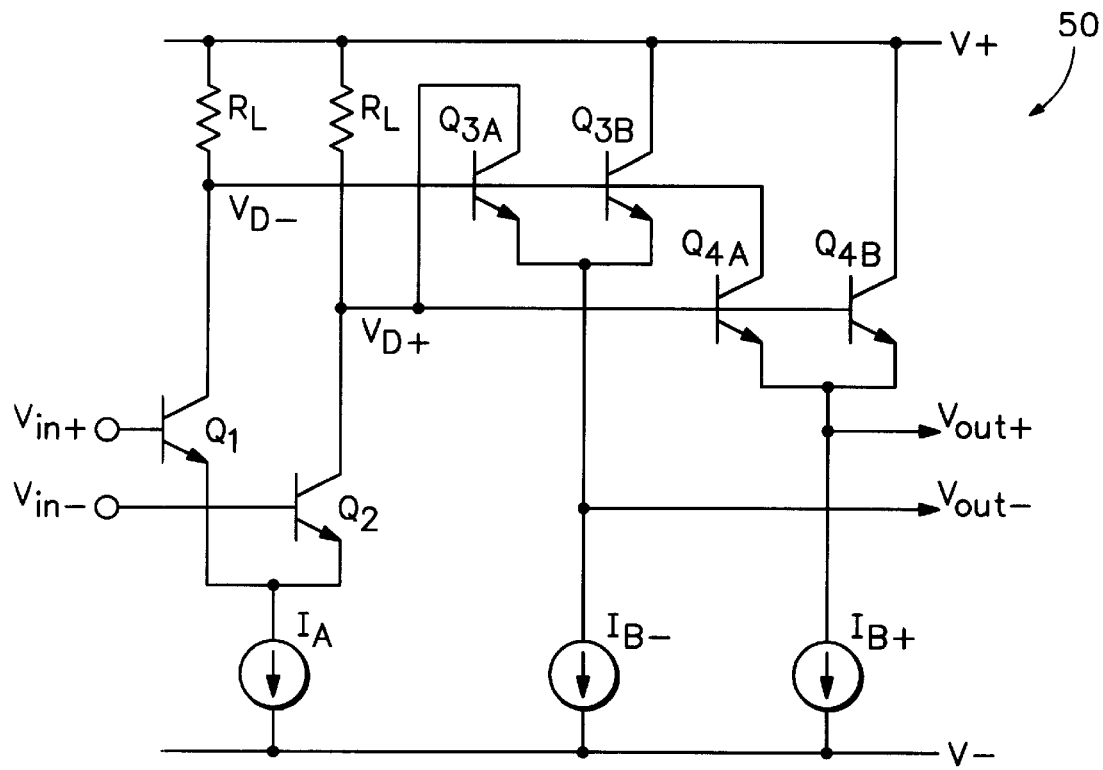
FIGS. 4 and 5 show several embodiments of amplifier stages that compensate for load impedance changes according to the invention.

FIG. 4 shows a first embodiment of a differential voltage amplifier stage according to the invention. A differential pair $Q_1$, $Q_2$ accepts a differential input voltage signal. The differential pair is biased by a shared constant current source $I_A$. An amplifier load $R_L$ is attached between a reference voltage $V_+$ and the collector of $Q_1$. A second load $R_L$, matched to the first, is similarly attached to $Q_2$. The output of the differential pair is taken differentially at nodes $V_{D-}$, $V_{D+}$.

Two matched output buffers produce the drive current for the amplifier stage. The first output buffer consists of a split-collector transistor pair $Q_{3A}$, $Q_{3B}$ with their emitters connected to a constant current source $I_{B-}$. The second output buffer consists of a second split-collector transistor pair $Q_{4A}$, $Q_{4B}$ similarly connected with a constant current source $I_{B+}$. One transistor in each split-collector transistor pair is connected in a conventional emitter-follower configuration, with its base connected to one of the differential-pair output nodes, its collector tied to voltage supply $V_+$, and its output taken at its emitter. The second transistor in each split-collector transistor pair has the same base and emitter connections as the first. But its collector is cross-connected to the base connection of the other split-collector transistor pair.

Figure 3:
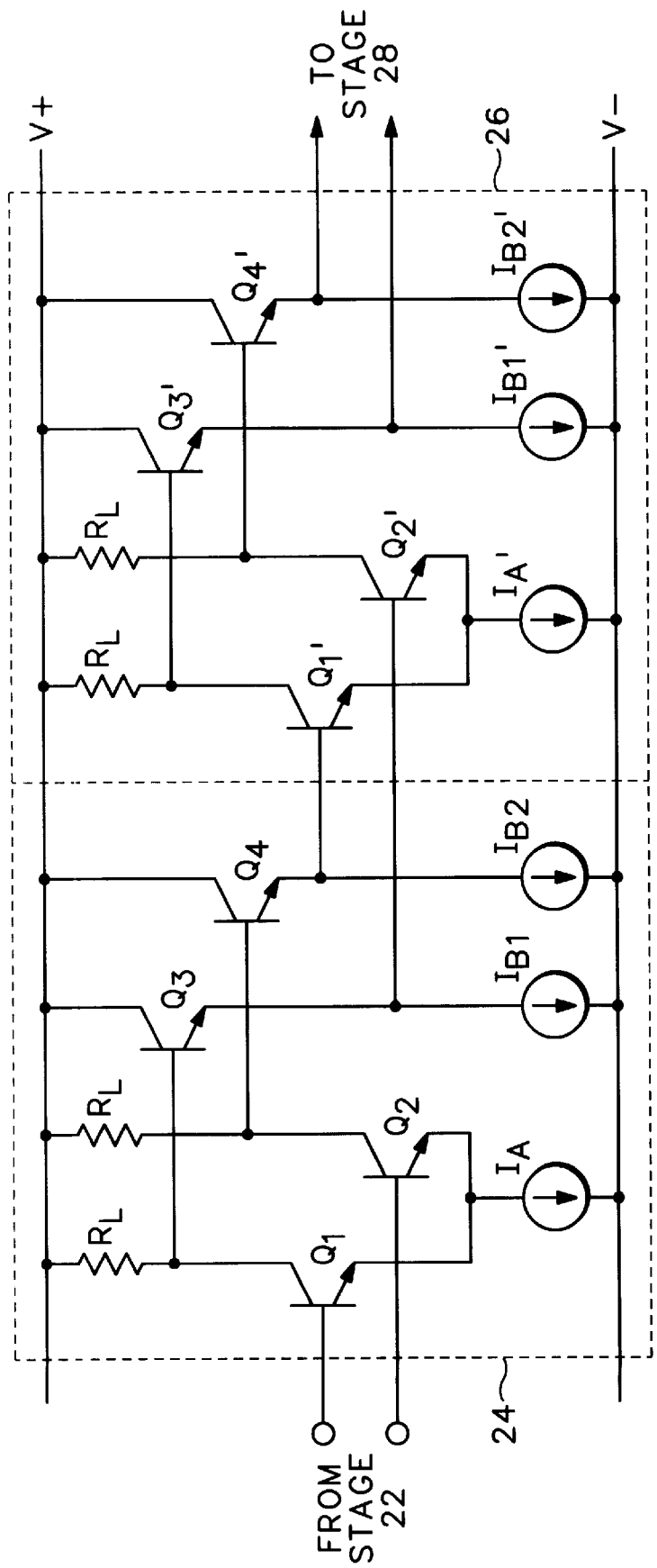

In operation, the output buffers still function primarily as emitter followers. With no load attached, the AC voltage differential output is unchanged from the output of a conventional amplifier stage such as stage 26 of FIG. 3. But a portion of the output buffer bias currents pass through the amplifier loads $R_L$, thus shifting the DC bias points of the differential pair and the amplifier stage as a whole.

When a load is attached to nodes $V_{out+}$, $V_{out-}$, amplifier stage 50 behaves differently than amplifier stage 26. For instance, the drive current for a load attached to node $V_{out+}$, is supplied by the combined emitter currents of transistors $Q_{4A}$ and $Q_{4B}$. If these transistors have at least reasonably high β values, almost all of this emitter current is supplied through their collectors. But the collector current for $Q_{4A}$ is drawn from node $V_{D-}$, and thus passes through the load $R_L$ that is also attached to that node. This lowers the voltage at $V_{D-}$, and consequently, the voltage at $V_{out-}$. A similar effect is observed at $V_{out+}$ for a load attached at $V_{out-}$.

Note that as the output load attached to one output draws more current, the voltage at the other output is decreased. Since the output at the higher voltage will draw more current for equal loading on both outputs, the output at the lower voltage will drop more than the output at the higher voltage due to the effect of the output loading, thereby causing a net gain in the output differential voltage that is keyed to the load impedance. As the load impedance drops, the feedback to the driving stage increases.

An amplifier stage input has a frequency-dependent impedance that is predominantly capacitive. As the frequency of the signal applied to the amplifier stage increases, the input impedance of the stage decreases, slowly at first, but then more rapidly as the capacitive component of the input impedance becomes equal to, and eventually less than, the resistive component. As a result, the gain of the amplifier stage rolls off with frequency.

Amplifier stage 50 can be used to extend the bandwidth of an amplifier past the point where the capacitive loading of the following stage begins to deteriorate amplifier gain. Because of the feedback path in the cross-connected output buffers, a net increase in gain is observed for a net decrease in output load impedance. At the same time that capacitive loading begins to decrease the gain of a stage, the same loading increases the gain for the preceding stage. Thus the output buffer configuration of amplifier stage 50 tends to automatically modify the overall stage gain to compensate for the reduction in the input impedance of the following stage.

One benefit of this embodiment of the invention is that the gain vs. load impedance characteristic can be modified by changing the percentage of drive current that is drawn through the collectors of the output buffer "A" transistors. If the "A" and "B" transistors have identical characteristics, half of the current will be drawn through the "A" transistors. By changing the characteristics of the "A" transistors as compared to the "B" transistors—specifically, by changing their size—different percentages of drive current, and thus different gain vs. load impedance characteristics, can be achieved.

Figure 5:
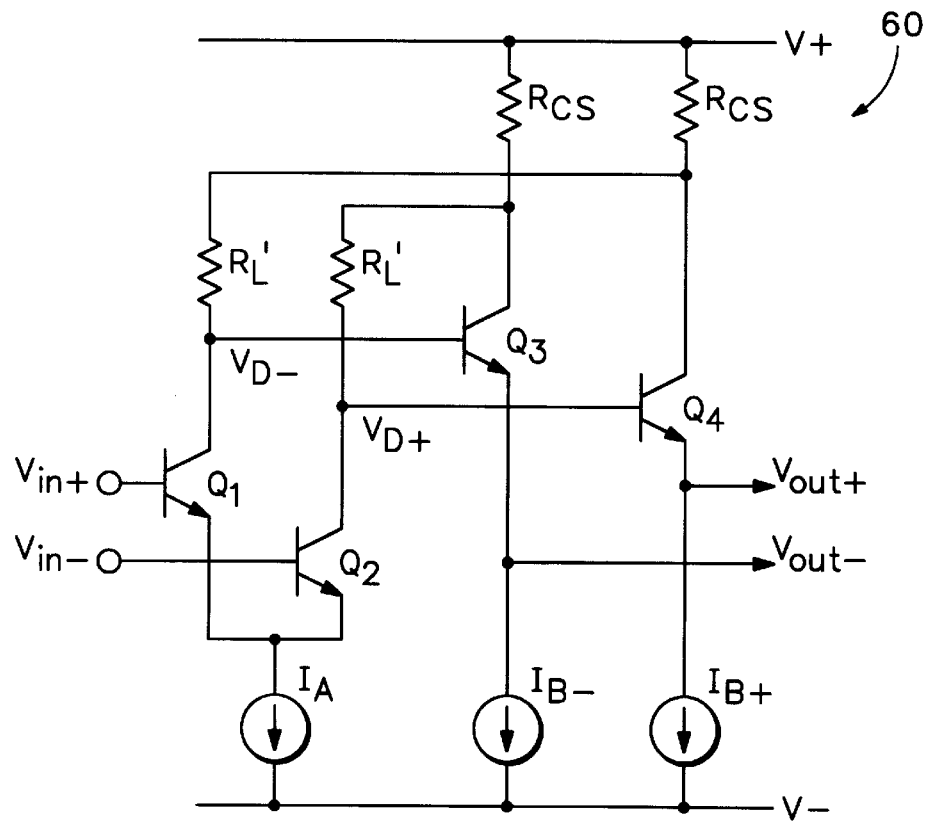

The embodiment of FIG. 5 accomplishes the same result as the preceding embodiment, but in a different way. Instead of splitting the output buffer transistors as in FIG. 4, amplifier stage 60 splits each amplifier load $R_L$ into two series-connected loads, a current-sensing load $R_{CS}$ and a main amplifier load $R_L'$. Each of the output buffer transistors $Q_3$ and $Q_4$ draws its collector current through the current-sensing load $R_{CS}$ that is part of the current path connected back to the base of the other output buffer transistor, through the load resistor $R_L'$ of the main gain stage.

Amplifier stage 60 provides a configuration that tends to automatically alters its AC response so as to compensate for variations in the input impedance of the following stage. If the output load requires more drive current, this lowers the voltage at the collectors of the output buffers. This in turn lowers the voltage at $V_{D+}$ and $V_{D-}$, since the currents through $Q_1$ and $Q_2$ remain unchanged. Through an analysis similar to the one presented for amplifier stage 50 above, it can be seen that amplifier stage 60 has an overall gain that is dependent on the input impedance of the next stage.

The gain vs. load impedance characteristic of stage 60 can be adjusted by adjusting the percentage of the amplifier load path that is also used for current-sensing. Thus the beneficial extension of the operating frequency range can be adjusted by changing the ratio of $R_{CS}$ to $R_L'$.

Figure 6:
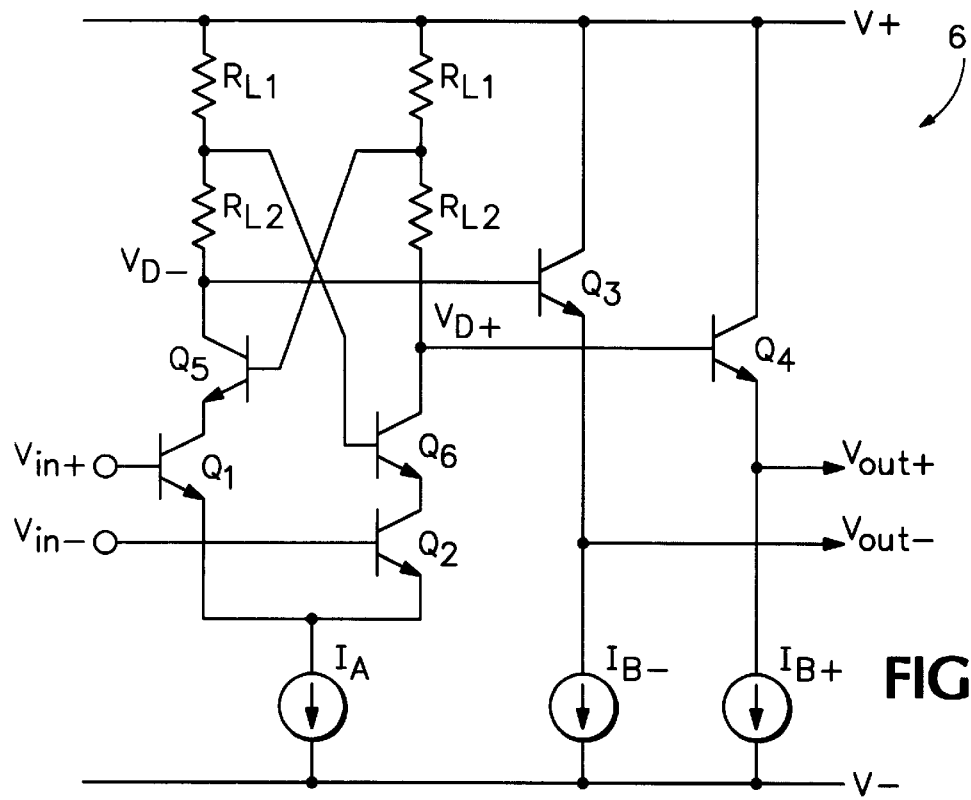
FIG. 6 shows an embodiment that compensates for input transistor capacitance according to the present invention.

FIG. 6 shows an amplifier stage 65 that uses cascode transistors $Q_5$ and $Q_6$ in a particular cross-connected arrangement to extend the bandwidth of the stage. Transistor $Q_5$ is connected in a cascode arrangement with $Q_1$, and transistor $Q_6$ is connected in a cascode arrangement with $Q_2$. Like a traditional cascode, this arrangement isolates the load resistors $R_{L1}$, $R_{L2}$ from the collector capacitance of the input transistors $Q_1$, $Q_2$. Unlike a traditional cascode, this arrangement does not use a purely common-base transistor in the cascode position.

The base of transistor $Q_5$ is biased through a cross-connection to load $R_{L1}$ of the current path serving transistor $Q_6$. Transistor $Q_6$ is likewise cross-connected. Thus when current is shifting to one leg of the differential cell, the base voltage of the cascode transistor in that leg is also rising because of the cross connection. Essentially, a fraction of the output voltage appearing at the collector nodes of $Q_5$ and $Q_6$ is connected by a feedback path back to their bases.

The complex impedance at the emitter of $Q_5$ at low frequencies is the relatively high impedance at the collector of $Q_1$. This impedance decreases with frequency because of the collector junction capacitances $C_{JC}$ and $C_{JS}$ of $Q_1$. But when the cross-connected compensating transistors see this junction capacitance, they cause the amplifier's output to change like this was a "negative" capacitance because of the cross-connection at their bases. This can be used to counter the high-frequency pole caused by collector junction capacitance and extend the circuit's useful bandwidth. Because this effect is keyed to the collector impedance of the main amplifier, the circuit is self-compensating with regard to the junction capacitances.

Figure 7:
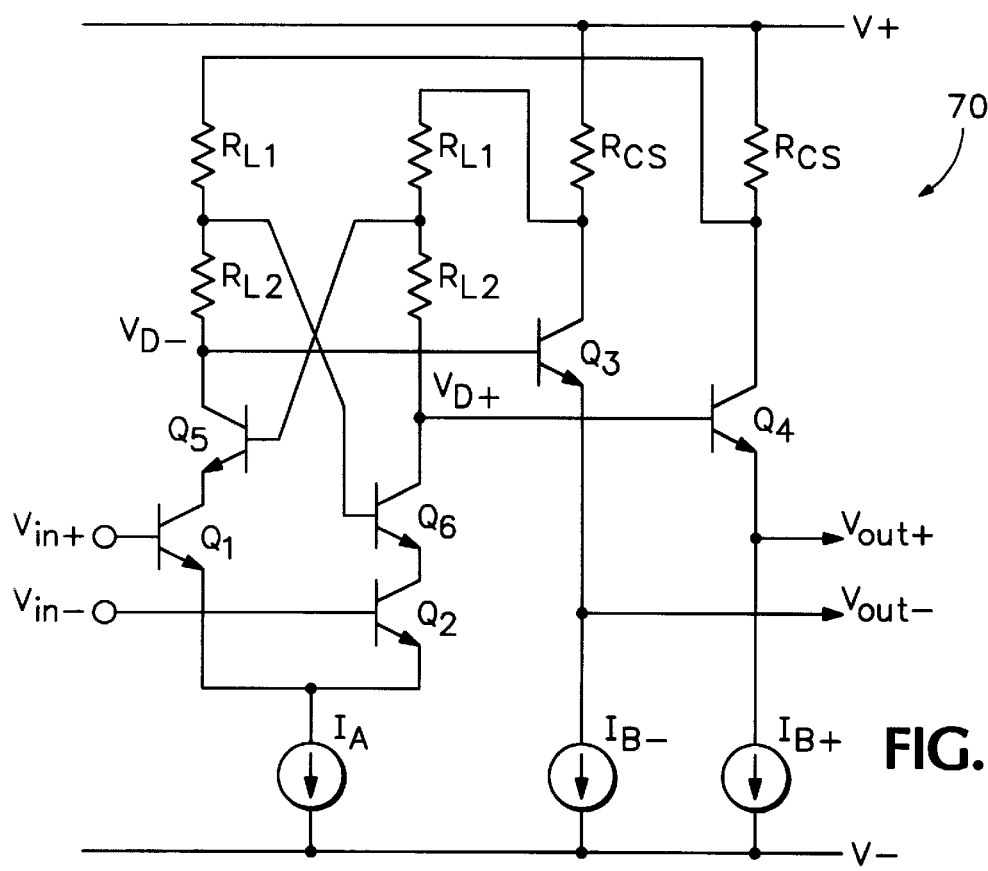
FIG. 7 shows a combination of the embodiments of FIGS. 5 and 6.

The embodiments of FIGS. 5 and 6 can be combined in a circuit that compensates for both input capacitance in the next amplifier stage and collector junction capacitance of the particular stage. FIG. 7 shows such a circuit as amplifier stage 70. Stage 70 splits the loads of the differentially-connected current paths into a current-sensing load $R_{CS}$, a compensating is transistor bias load $R_{L1}$, and a main load $R_{L2}$. Although not illustrated, the embodiments of FIGS. 4 and 6 could be combined to produce a similar effect.

A progressive-compression logarithmic amplifier with bandwidth extension according to the invention uses load-compensating amplifier stages such as those disclosed above. For example, amplifier stages similar to amplifier stage 50 (or stage 60 or 70) can be substituted for each of amplifier stages 22, 24, 26, and 28 in FIG. 1, forming a new logarithmic amplifier according to the invention. The stage loading positive feedback path in stage 50 automatically adjusts the stage gain in response to input impedance changes in a following stage. Thus as the basic amplifier gain begins to roll off above the corner frequency, the feedback path boosts gain to compensate. Other effects will reduce the efficacy of this compensation at still higher frequencies, but the invention provides a considerable bandwidth extension before these other effects become troublesome.

The concepts taught herein can be extended in many advantageous ways. For example, different effects can be realized by over- or under-compensating for impedance changes. An analogous amplifier stage can also be designed using field-effect transistors.

Other minor modifications are encompassed within the invention. It is understood that specific values for currents, voltages, resistance values, gains, etc., will depend on a particular application, and the selection of such is within the ordinary skill in the art. A split-collector transistor configuration can be formed with two transistors, or with a single transistor having a single base and a single emitter shared by two collectors. The exact overall configuration or component values chosen for a amplifier stage according to the invention is unimportant, as long as the structure allows a load-sensing path that modifies gain. These and other such modifications are intended to fall within the scope of the claims.

What is claimed is:

1. An amplifier stage comprising:
   a differential input gain section for generating a differential output signal, responsive to an input signal, at a pair of differential output nodes;
   a first output buffer coupled to the input gain section at one of the output nodes; and
   a second output buffer coupled to the input gain section at the other of the output nodes;
   wherein the first and second buffers are configured to automatically adjust the stage gain to compensate for changes in the output load impedance presented to the stage.

2. The amplifier stage of claim 1, wherein the differential input gain section comprises two differentially-connected current paths with one of the output nodes in each path, each path comprising an amplifier load, and wherein both output buffers draw at least a portion of their respective output drive currents through at least a portion of the amplifier load of the current path connected to the other output buffer.

3. The amplifier stage of claim 2, wherein each amplifier load comprises series-connected current-sensing and main loads, with the current-sensing load end of the amplifier load connected to a reference voltage, and wherein each output buffer draws its output drive current through the current-sensing load of the current path connected to the other output buffer.

4. The amplifier stage of claim 2, wherein each output buffer comprises a split-collector bipolar transistor, with a first collector connected to a reference voltage and a second collector connected to the base connection of the other output buffer.

5. The amplifier stage of claim 4, wherein the split-collector transistor comprises two bipolar transistors with their bases tied together and their emitters tied together.

6. The amplifier stage of claim 2, wherein the differential input gain section and output buffers are implemented using bipolar transistors.

7. The amplifier stage of claim 2, wherein the differential input gain section and output buffers are implemented using field-effect transistors.

8. The amplifier stage of claim 2, wherein each differentially-connected current path further comprises an input transistor and a gain selection transistor, with the emitter of the gain selection transistor supplying collector current to the input transistor, and wherein the base of the gain selection transistor in each current path is cross-connected to at least a portion of the other current path's amplifier load.

9. The amplifier stage of claim 8, wherein each amplifier load comprises series-connected current-sensing and main loads, with the current-sensing load end of the amplifier load connected to a reference voltage, and wherein each output buffer draws its output drive current through the current-sensing load of the current path connected to the other output buffer.

10. The amplifier stage of claim 8, wherein each output buffer comprises a split-collector bipolar transistor, with a first collector connected to a reference voltage and a second collector connected to the base connection of the other output buffer.

11. An amplifier stage differential input gain section comprising:
   two differentially-connected current paths, each path comprising first and second serially-connected loads, an input transistor, and a cascode transistor, with the emitter of the cascode transistor supplying collector current to the input transistor, with the collector of the cascode transistor drawing current from the second load, and wherein the base of the cascode transistor in each current path is cross-connected to the first load of the other current path.

12. A progressive-compression logarithmic amplifier comprising:
   multiple amplifier stages connected in series, including a first amplifier stage that is followed by another amplifier stage, the first amplifier stage comprising a differential input gain section, an output buffer section, and a stage loading positive feedback path that automatically adjusts the gain of the stage to compensate for input impedance changes in its following stage.

13. The logarithmic amplifier of claim 12, wherein the stage loading positive feedback path in the first amplifier stage comprises an output buffer drive current path that draws at least part of its following stage's input current through circuitry also connected within the differential input gain section.

14. The logarithmic amplifier of claim 13, wherein each amplifier stage that is followed by another amplifier stage has the configuration of the first amplifier stage.

15. The logarithmic amplifier of claim 12, wherein each amplifier stage that is followed by another amplifier stage has the configuration of the first amplifier stage.

16. A method for increasing the bandwidth of a differential-input progressive-compression logarithmic amplifier, comprising the steps of:
   amplifying, through a differential-pair amplifier having two load paths, a differential voltage input at a first stage of the logarithmic amplifier, thereby producing an amplified differential voltage output at a pair of differential-pair output nodes, one node in each load path;
   buffering the amplified differential voltage output through a pair of output buffers, one inserted between one of the differential-pair output nodes and one of the stage differential voltage outputs, and the other inserted between the other of the differential-pair output nodes and the other of the stage differential voltage outputs, thereby supplying drive current to the differential voltage inputs of a second stage of the logarithmic amplifier through the pair of output buffers of the first stage;
   sensing the drive current required at each differential voltage input of the second stage; and
   responding to an increase in drive current required at one differential voltage input of the second stage by changing the voltage at the other differential voltage input of the second stage.

17. The method of claim 16, wherein the sensing and responding steps comprise drawing at least a portion of the drive current supplied by each of the output buffers through at least a portion of the load path of the differential pair that the other of the output buffers is connected to.

18. The method of claim 16, wherein the sensing and responding steps comprise drawing the drive current supplied by each of the output buffers through a predefined percentage of the load path of the differential pair that the other of the output buffers is connected to.

19. The method of claim 18, wherein the predefined percentage of the load path sets the gain vs. load impedance characteristic for the first stage such that it approximately compensates for a high-frequency gain loss in the logarithmic amplifier, thereby extending the useful bandwidth of the logarithmic amplifier.

20. The method of claim 16, wherein the sensing and responding steps comprise drawing a predefined percentage of the load current supplied by each of the output buffers through the entire load path of the differential pair that the other of the output buffers is connected to.

21. The method of claim 20, wherein the predefined percentage of the load current sets the gain vs. load impedance characteristic for the first stage such that it approximately compensates for a high-frequency gain loss in the logarithmic amplifier, thereby extending the useful bandwidth of the logarithmic amplifier.

* * * * *

UNITED STATES PATENT AND TRADEMARK OFFICE
CERTIFICATE OF CORRECTION

PATENT NO. : 6,144,244
DATED : November 7, 2000
INVENTOR(S) : Barrie Gilbert

It is certified that error appears in the above-identified patent and that said Letters Patent is hereby corrected as shown below:

Column 1,
Line 43, "Vout" should read -- Vout $\propto$ --
Line 49, "Vout" should read -- Vout $\propto$ --

Column 6,
Line 44, "comer" should read -- corner --.

Signed and Sealed this

Eighteenth Day of February, 2003

JAMES E. ROGAN
*Director of the United States Patent and Trademark Office*